United States Patent [19]

Christou et al.

[11] 4,179,533

[45] Dec. 18, 1979

[54] MULTI-REFRACTORY FILMS FOR GALLIUM ARSENIDE DEVICES

[75] Inventors: Aristos Christou, Springfield, Va.; Howard M. Day, Hillcrest Heights, Md.

[73] Assignee: The United States of America as represented by the Secretary of the Navy, Washington, D.C.

[21] Appl. No.: 899,935

[22] Filed: Apr. 25, 1978

[51] Int. Cl.² .......................................... H01L 29/48
[52] U.S. Cl. .................................... 427/84; 357/15; 357/71; 427/85; 427/89; 427/91; 427/124; 427/125
[58] Field of Search ..................... 427/84, 88, 89, 124, 427/91, 125, 85; 357/15, 71

[56] References Cited

U.S. PATENT DOCUMENTS

| | | | |
|---|---|---|---|
| 3,886,580 | 5/1975 | Calviello | 357/15 |
| 3,906,540 | 9/1975 | Hollins | 357/15 |
| 4,034,394 | 7/1977 | Kamo et al. | 357/15 |
| 4,062,103 | 12/1977 | Yamagishi | 427/84 |

OTHER PUBLICATIONS

Christou et al., "A Comparison of Ta and Al Schottky-Barrier Gates for GaAs FETs Using Prespot Augex Electron Spectroscopy", Inst. Phys. Conf. Ser. No. 33(b), 1977, pp. 191-200.

Day et al., "Interdiffusion and Schottky-Barrier Height Variations in Au-W(Ti)/N-GaAs Contacts", J. Vac. Sci. Technology, vol. 14, No. 4, Jul./Aug. 1977.

*Primary Examiner*—John D. Smith
*Attorney, Agent, or Firm*—R. S. Sciascia; Philip Schneider; Vincent J. Ranucci

[57] ABSTRACT

A method for constructing systems of refractory layers for use in making gallium arsenide (GaAs) semiconductor devices, having gold as the conducting electrode, which devices are thermally stable when thermally stressed up to about 600° C. for approximately 24 hours. The method forms refractory layers of either tantalum-platinum-tantalum, or tungsten-platinum-tungsten, or titanium tungsten-platinum to develop both the Schottky barrier to GaAs and the diffusion barrier between gold and GaAs. Each of the refractories are individually deposited, at specific temperatures in the range of 50° C. to 175° C., on a GaAs wafer within a vacuum. The metalized wafer cools to room temperature and is removed from the vacuum. Contacts are then typically defined on the wafer and the wafer is subsequently bonded.

7 Claims, 4 Drawing Figures

MULTI-REFRACTORY FILMS FOR GALLIUM ARSENIDE DEVICES

BACKGROUND OF THE INVENTION

This invention relates generally to the production of GaAs semiconductor devices and more particularly to a method for constructing systems of refractory layers for GaAs semiconductor devices having a gold electrode.

Refractory layer systems in GaAs semiconductors provide both a Schottky barrier with the GaAs and a diffusion barrier between the GaAs and the gold conductor. Existing methods for manufacturing GaAs semiconductors utilize systems of refractory layers which include metals or combinations of metals that are different from those of the present invention. The layers formed by current methods are deposited on a GaAs wafer at approximately room temperature and typically within a vacuum. The wafer is then removed from the vacuum and annealed at temperatures as high as 800° C. Devices fabricated with existing refractory systems fail from exposure and continuous use of more than a few hours at high stress temperatures above 450° C. because of interdiffusion between the gold layer and the GaAs, and variations of the Schottky barrier due to both interdiffusion and the formation of interfacial layers between the barrier layer and the GaAs. Removal of the wafer from the vacuum before annealing may expose the wafer to contaminants and thereby reduce its reliability. The high processing temperatures tend to degrade the characteristics of the GaAs when forming semiconductors using vertical technology. The Schottky barriers thus formed, however, are thermally stable at high temperatures, but only for a short time ranging from a few minutes to a few hours. High-temperature heat treatment is also unsuitable for semiconductors formed by planar technology because of degradation to the GaAs and both the isolation layer, typically silicon dioxide (SiO$_2$), and the metal-semiconductor interfaces existing in a planar structure. Consequently, existing semiconductors formed by planar technology are developed using lower processing temperatures and are not thermally stable at high temperatures. Therefore, conventional methods for constructing refractory layer systems are not adequate to develop GaAs semiconductors which are thermally stable at temperatures above 450° C. during continuous periods of up to about 24 hours of thermal stress.

SUMMARY OF THE INVENTION

It is the general purpose and object of the present invention to efficiently construct highly reliable refractory layer systems for GaAs semiconductor devices having gold as the conducting electrode which will be thermally stable at temperatures above 450° C during long continuous periods of up to approximately 24 hours of thermal stress. This and other objects of the present invention are accomplished by individually depositing refractory layers of either tantalum-platinum-tantalum, or tungsten-platinum-tungsten or titanium tungsten alloy-platinum on a GaAs substrate within a vacuum at specific substrate temperatures, in the range of 50° C. to 175° C., that are sufficient to seal the refractory layers for preventing grain boundary migration of GaAs and gold.

The present invention includes the following novel features: the refractory layer system of either tantalum-platinum-tantalum, or tungsten-platinum-tungsten or titanium tungsten-platinum separate the GaAs from the gold electrode; and each deposition of each of the refractory layers is exposed to a temperature in the range of 50° C. to 175° C. in a vacuum such that the deposition, heating and formation of the entire refractory system on the GaAs wafer are accomplished within a vacuum.

The advantages of this method over existing methods for constructing semiconductor devices are: processing at temperatures above 175° C. is unnecessary; heating at low temperatures up to 175° C. neither changes the characteristics of GaAs in a device developed by vertical or planar technology, nor degrades the SiO$_2$ and the interface of existing elements in a planar structure; the refractory layer systems are efficiently deposited on a GaAs wafer at low temperatures; the refractory systems may be formed using planar or vertical technology to develop GaAs semiconductors with a Schottky barrier to GaAs and a separation between GaAs and gold which are thermally stable during continuous thermal stress for approximately 24 hours at temperatures up to about 600° C.; the systems are not exposed to contaminants outside a vacuum during formation so the interfaces within the system are clean; and, the refractory systems provide higher reliability for all GaAs devices processed with this method.

Other objects and advantages of the invention will become apparent from the following detailed description of the invention when considered in conjunction with the accompanying drawings wherein:

DESCRIPTION OF THE INVENTION

Figure 1:
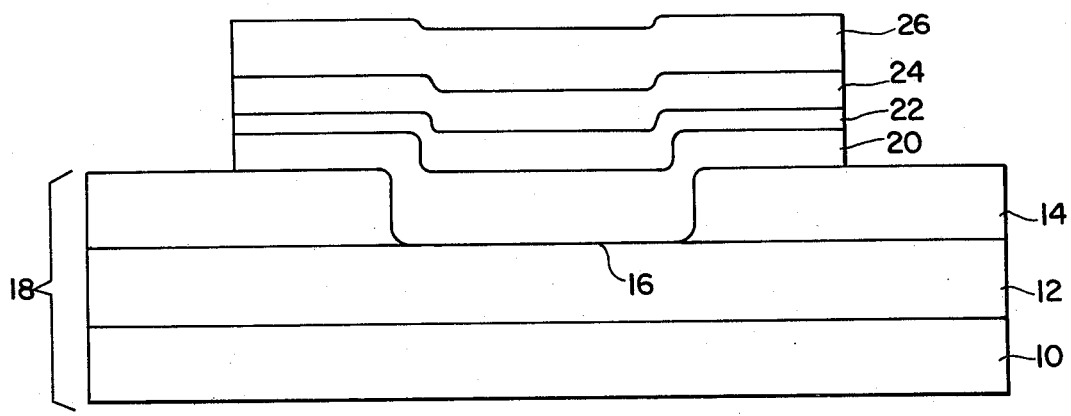
FIGS. 1 and 2 are sectional views of semiconductor devices developed with planar technology, illustrating the tantalum-platinum-tantalum or tungsten-platinum-tungsten (FIG. 1) and titanium tungsten-platinum (FIG. 2) embodiments of the invention. Vertical technology illustrates the same views as FIGS. 1 and 2 except that no isolation layer such as silicon dioxide is used in the vertical structure.

Referring now to the drawings, wherein like reference characters designate like or corresponding parts throughout the several views, FIG. 1 shows the first embodiment of this invention. This embodiment includes a single crystal GaAs substrate 10 prepared in any suitable manner, such as with n+ material doped with approximately $2 \times 10^{18}$ tellurium atoms per cubic centimeter for potential use as a diode, or with semi-insulated material of approximately $1 \times 10^7$ ohms-centimeters resistivity to be used for development of a field effect transistor. A GaAs epitaxial layer 12 about 2000 angstroms (Å) thick and including an n-type dopant of about $1 \times 10^{17}$ atoms per cubic centimeter is typically grown on the substrate 10. A silicon dioxide (SiO$_2$) layer 14 of approximately one-half of a micron is conveniently deposited, such as by thermal oxidation, on the epitaxial layer 12. A window 16 of the SiO$_2$ is suitably etched, as with hydrofluoric acid, and then further typically etched using a solution of 10 milliliters hydrochloric acid (HCl), 10 milliliters of hydrofluoric acid (HF), 40 milliliters of water, and 5 drops of hydrogen peroxide (H$_2$O$_2$) to clear contaminants from the window. Note that, as previously discussed, SiO$_2$ is not used for constructing semiconductors with vertical technology.

The wafer 18 is inserted in a chamber which maintains a vacuum of at least 1×10$^{-7}$ Torr. A tantalum layer 20 about 1000 Å thick is deposited on the wafer 18 at a substrate temperature, approximately 90° C., sufficient to desorb interfacial oxides and surface impurities and to provide adhesion between the tantalum and GaAs. Approximately 300 Å of platinum 22 is deposited on the tantalum layer 20 at a substrate temperature, within the range of about 90° C., to 175° C., which is sufficient for causing the platinum to migrate to the tantalum grain boundaries and seal the tantalum GaAs boundary, and thereby prevent grain boundary migration of the GaAs. Next, a final film of tantalum 24 about 1000 Å thick is deposited on the platinum 22 at a substrate temperature, approximately between 50° and 90° C. sufficient to interdiffuse the tantalum 24 into the platinum 22 and provide adhesion therebetween, and thereby seal the platinum from the gold. Thereafter, a conducting layer of gold 26, approximately 3000 Å in thickness, is deposited on the second layer of tantalum 24 at a substrate temperature within the range of about 50° to 90° C. The metalized wafer cools to room temperature and is removed from the vacuum chamber. The discrete contacts are formed by standard lithographic techniques, and the wafer is then typically bonded. In this embodiment, the layers 20, 22, 24 and 26 are formed using an electron-beam evaporation technique, but other suitable methods, such as known thin-film deposition techniques, may be used. Also, layers 20,22,24, and 26 require exposure to the appropriate temperatures for not more than five minutes.

The first layer of tantalum 20 forms a Schottky barrier between the tantalum and GaAs 10 and 12. The platinum 22 is deposited on the tantalum 20 at a temperature of about 90° to 175° C. to allow the platinum to dope the tantalum grain boundaries and thereby seal the grain boundaries to prevent grain boundary migration of gallium 10 and 12 and gold 26. However, sufficient platinum 22 exists to interdiffuse with the gold 26. Therefore, the second layer of tantalum 24 is deposited as a barrier between the platinum 22 and gold 26. Tungsten layers, deposited to approximately the same thicknesses and about the same temperatures, can be utilized instead of the tantalum layers 20 and 24 shown in FIG. 1.

Figure 2:
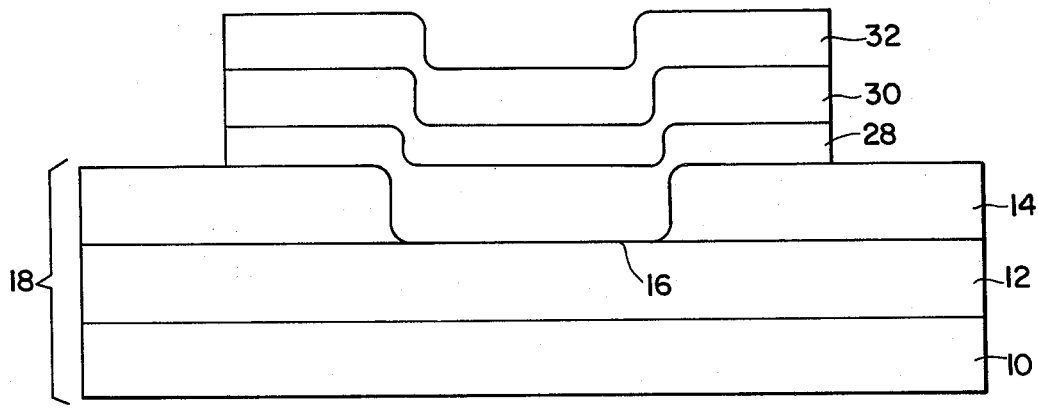

FIG. 2 shows the second embodiment of this invention which has a wafer 18, including a substrate 10, an epitaxial layer 12, and a layer of SiO$_2$ 14 prepared and etched in the same manner as the first embodiment. The second embodiment also requires that the wafer 18 be inserted in a chamber which maintains a minimum vacuum of 1×10$^{-7}$ Torr. A layer of titanium tungsten alloy 28, 10% titanium and 90% tungsten by weight, is deposited on the wafer 18 to a thickness of about 2000 Å at a substrate temperature, approximately 110° C.,sufficient to desorb interfacial oxides and surface impurities and to provide adhesion between the titanium tungsten and GaAs. A platinum layer 30, approximately 3000 Å thick, sufficient to interact with the titanium tungsten but not to interdiffuse with the gold electrode, is deposited on the titanium tungsten 28 at a substrate temperature, about 90° C., sufficient for causing the platinum to migrate to the titanium tungsten grain boundaries and seal the titanium tungsten-GaAs boundary, and thereby prevent grain boundary migration of the GaAs. Next, a conducting gold film 32 about 3000 Å thick is deposited on the platinum 30 at a substrate temperature within the range of about 50° to 90° C. The metallized wafer cools to room temperature and is removed from the vacuum chamber. The discrete contacts are formed by standard lithographic techniques, and the wafer is then typically bonded. The layers 28, 30 and 32 may be formed using the same technique as the first embodiment, and these layers also require exposure to the appropriate temperatures for not more than five minutes. The titanium tungsten 28 forms a Schottky barrier between the titanium tungsten and GaAs 12, and a diffusion barrier between the GaAs and gold 32. The platinum 30 passivates the titanium 28, therby preventing the titanium from forming titanium oxide, a contaminant. The platinum 30 also provides adhesion between the titanium tungsten 28 and the gold 32 and prevents interdiffusion therebetween. Insufficient platinum 30 is used to permit it to interdiffuse with the gold 32 in this embodiment.

Figure 3:
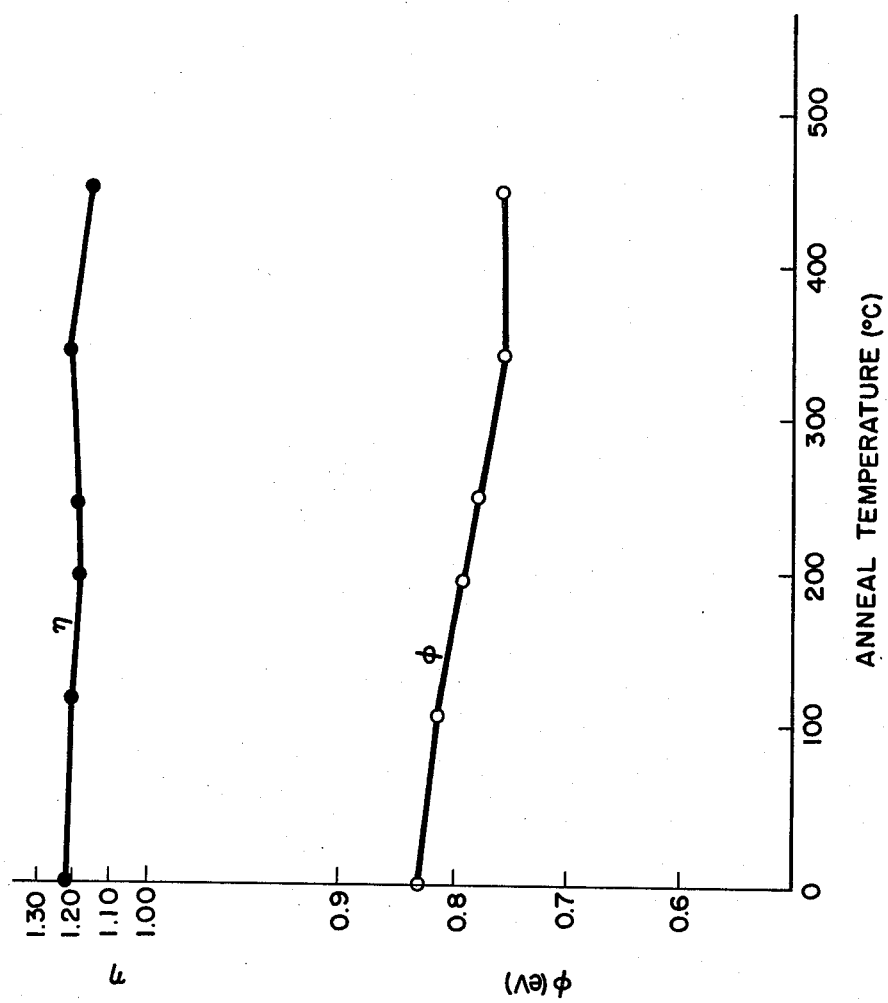
FIGS. 3 and 4 are graphs illustrating the barrier height ($\phi$) and diode ideality factor ($\eta$) variations with anneal temperature for an electron beam-deposited tantalum-GaAs or tungsten-GaAs Schottky diode (FIG. 3) and an electron beam-deposited titanium tungsten-GaAs Schottky diode (FIG. 4).
Figure 4:
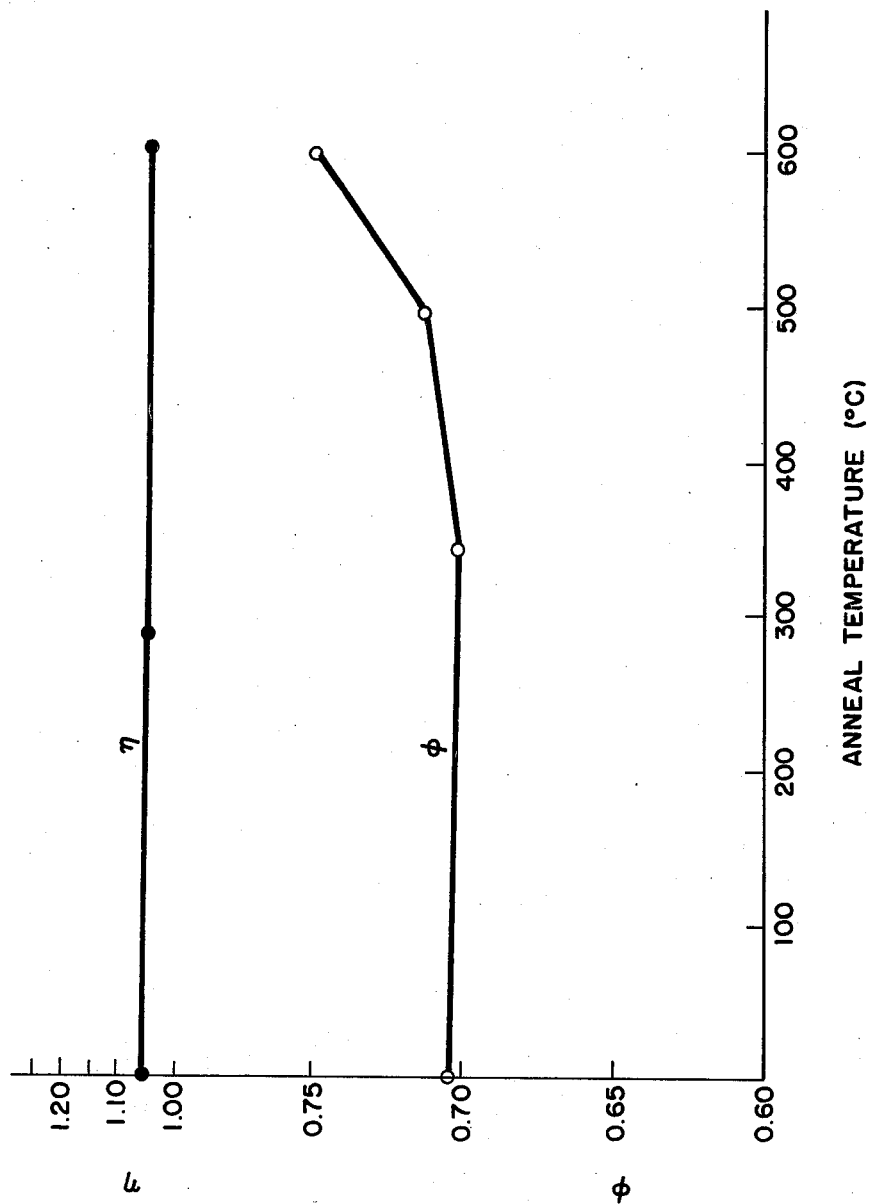

FIG. 3 shows that the tantalum-GaAs or tungsten-GaAs Schottky barrier height ($\phi$) decreases from 0.82 electron-volts (eV) at low temperatures to 0.75 eV after annealing at 450° C. The ideality factor ($\eta$) decreases slightly from 1.20 to 1.17 during the annealing. The decrease in barrier height is considered to be associated with interfacial reactions. FIG. 4 shows an essentially stable titanium tungsten-GaAs Schottky barrier height at bout 0.70 eV from low temperatures through annealing at 500° C. where the barrier height begins to increase to 0.75 eV after annealing at 600° C. The quality factor remains at 1.05 during the annealing.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method for constructing systems of sealed refractory layers, in a vacuum, for GaAs semiconductor devices having gold as a conducting electrode, said method requiring no annealing of said systems, comprising the steps of:

forming a refractory layer of a material selected from the group consisting of tantalum, tungsten, and titanium tungsten alloy on a surface of a GaAs substrate for providing a Schottky barrier therebetween, said substrate being maintained at an elevated temperature of approximately 90° C. for said tantalum and said tungsten and approximately 110° C. for said titanium tungsten alloy, said temperatures being sufficient for desorbing interfacial oxides and surface impurities and for providing adhesion between said refractory layer and GaAs;

sealing said refractory layer by depositing a layer of platinum at a substrate temperature in the range of appproximately 90° C. to 175° C. for the tantalum and the tungsten and approximately 90° C. for the titanium tungsten alloy, said temperature being sufficient for doping said refractory layer with the platinum, causing said platinum to migrate to the refractory grain boundaries and seal said boundaries, and preventing grain boundary migration of said GaAs and gold; and sealing said layer of platinum from said gold by depositing a layer of tantalum at a substrate temperature in the range of approximately 50° C. to 90° C. if said refractory layer is tantalum, or by depositing a layer of tungsten at a substrate temperature in the range of approximately 50° C. to 90° C. if said refractory layer is tungsten, said temperature being sufficient for interdiffusing said tantalum or said tungsten into said platinum and preventing interdiffusion between the platinum and the gold, said steps providing controlled heat in the range of about 50° C. to 175° C. to the substrate for individual depositions of said layers and providing thermal stabilization of the Schottky barrier and forming the entire refractory systems within a vacuum and without annealing the refractory systems, said systems forming a barrier layer of tantalum, tungsten, and titanium tungsten alloy doped with platinum at the tantalum, tungsten, and titanium tungsten alloy grain boundaries for preventing migration of said GaAs and gold across said grain boundaries.

2. A method as recited in claim 1 wherein each of said layers of tantalum is about 1000 Å in thickness.

3. A method as recited in claim 1 wherein each of said layers of tungsten is about 1000 Å thick.

4. A method as recited in claim 1 wherein said titanium tungsten alloy is 10% titanium and 90% tungsten by weight and said layer of titanium tungsten alloy is approximately 2000 Å in thickness.

5. A method as recited in claim 1 wherein said layer of platinum is about 300 Å thick for said tantalum and said tungsten, and about 3000 Å thick for said titanium tungsten alloy.

6. A method as recited in claim 1, wherein approximately 3000 Å of said gold electrode is formed at a substrate temperature in the range of about 50° to 90° C.

7. A method as recited in claim 1, wherein said vacuum is at least $1 \times 10^{-7}$ Torr.

* * * * *